United States Patent [19]
Ohshima

[11] Patent Number: 5,856,681
[45] Date of Patent: *Jan. 5, 1999

[54] SEMICONDUCTOR DEVICE

[75] Inventor: Toshio Ohshima, Kawasaki, Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 779,980

[22] Filed: Dec. 23, 1996

Related U.S. Application Data

[63] Continuation of Ser. No. 492,903, Jun. 20, 1995, abandoned.

[30] Foreign Application Priority Data

Oct. 4, 1994 [JP] Japan ................................. 6-240135

[51] Int. Cl.$^6$ .................................................. H01L 29/06
[52] U.S. Cl. ........................... 257/25; 257/194; 257/197; 257/252; 257/288
[58] Field of Search ............................... 257/25, 194, 197, 257/252, 288

[56] References Cited

U.S. PATENT DOCUMENTS

| | | | |
|---|---|---|---|
| 4,961,194 | 10/1990 | Kuroda et al. | 257/191 |
| 4,982,248 | 1/1991 | Laibowitz et al. | 257/194 |
| 5,412,231 | 5/1995 | Furuya | 257/194 |
| 5,455,441 | 10/1995 | Awano | 257/194 |

*Primary Examiner*—Mark V. Prenty
*Attorney, Agent, or Firm*—Armstrong, Westerman, Hattori, McLeland & Naughton

[57] ABSTRACT

The present invention relates to a semiconductor device in which an electric resistance in a carrier path is modulated by changing a voltage applied to the carrier path. The semiconductor device is provided with a semiconductor layer in which conductive particles are dispersed to scatter carriers, a first electrode, and a second electrode for passing the carriers through the semiconductor device in cooperation with the first electrode.

30 Claims, 12 Drawing Sheets plane direction → carrier film thickness direction

SEMICONDUCTOR DEVICE

This application is Continuation of application Ser. No. 08/492,903 filed Jun. 20, 1995, now abandoned.

BACKGROUND OF THE INVENTION

1. Field of the Invention

The present invention relates generally to a semiconductor device, and more particularly to a semiconductor device in which an electric resistance in a carrier path is modulated by changing a voltage applied to the carrier path.

2. Description of the Prior Art

In a conventional semiconductor integrated circuit device, a field-effect transistor (FET) and a bipolar transistor are mainly used as active elements, and a large scaled integrated circuit can be cheaply manufactured.

However, the number of interconnections in a chip has been recently increased enormously, an operation test of the chip has recently become impossible as a matter of fact, and a consumed electric power required for the chip cannot be moreover increased. Therefore, the integration level of chips in the conventional semiconductor device almost reaches its limit.

Therefore, an active element which is operated at a high speed and a low consumed electric power according to a new operation principle is required in place of the FET and the bipolar transistor.

Also, it has been recently required to process and store a large volume of data at a high speed, so that a magnetic recording device in which a large volume of data is recorded at a high density and a high speed has been recently required. In addition, a magnetic sensor operated at a higher speed and a higher sensitivity than a conventional one has been recently required.

SUMMARY OF THE INVENTION

An object of the present invention is to provide a semiconductor device having a high driving performance in which a large volume of data is processed at a high speed and a low consumed electric power.

Recently, metallic arsenic particles (or conductive particles) have become able to be precipitated in a gallium arsenide crystal layer at a high reproductivity. In the present invention, a semiconductor layer in which the conductive particles are contained is utilized as a transit region (or a channel region) for carriers.

In detail, when carriers pass through a semiconductor layer in which conductive particles are dispersed, a resistance (or a conductance) of the semiconductor layer depends on interaction between conductive particles and a group of carriers. An energy of the carriers or the number of carriers can be electrically changed by a third electrode with which either a Fermi energy of the semiconductor layer or an electric potential of the semiconductor layer is controlled. One or more excitation levels in a conductive particle such as excitation levels of individual electrons in the conductive particle, excitation levels of plasmons resulting from a collective motion of electrons in the conductive particle or excitation levels of phonons resulting from a shape vibration of a conductive particle can be electrically changed.

Therefore, the conductance of the semiconductor layer can be controlled through electrically controlling a resonance scattering of the carriers due to the excitation levels in the conductive particle and a spread of a depletion layer from each of the conductive particles which depends on the density of the carriers existing around the conductive particles.

In particular, because the excitation levels of the plasmons and that of the phonons are high, a semiconductor device which is proof against noises or is appropriate to an operation at a high temperature can be provided by controlling the resonance scattering through those excitation levels.

Also, the excitation levels of the electrons, plasmons or phonons in the conductive particle and various types of excitation spectra are changed by inducing a magnetic field in the semiconductor layer, so that the excitation levels in the conductive particle are changed. Therefore, the resonance scattering of the carriers is controlled, and the conductance of the semiconductor layer can be controlled. In this case, a magnetic detection system functions in the same manner as a switching of a semiconductor element. Therefore, a detection speed in this magnetic detection system is extremely high as compared with that in a conventional one. Also, when the resonance is narrowed in width and is sharpened, this magnetic detection system can react to even slight variation of the magnetic field intensity. Therefore, a magnetic sensor or the like having a high sensitivity can be provided.

Also, when a transit distance of the carriers in the semiconductor layer is set to be almost ten times as long as a Fermi wavelength of the carriers, even though the semiconductor layer has a thick film thickness, the resonance scattering can be reliably raised. Also, when the transit distance of the carriers is lengthened, a control range of the conductance can be widened.

Also, when the semiconductor device has a modulation doping structure in which a carrier supplying layer doped with impurities giving conductivity to the layer is provided outside the semiconductor layer where carriers pass through, even though any conductive type impurity is not doped in the semiconductor layer, the carriers can be supplied in the semiconductor layer. Accordingly, because the scattering of the carriers by impurity ions can be prevented, a mobility of the carriers in the semiconductor layer can be heightened, and the resonance scattering of the carriers by the conductive particles in a carrier path can be selectively generated. Therefore, the sensitivity in the semiconductor device can be heightened.

Also, a plane direction of the semiconductor layer or a direction perpendicular to it (hereinafter referred to as a film thickness direction) can be set to agree with a transit direction of the carriers. For example, in case where the transit direction of the carriers agrees with the plane direction, the carriers function as a two-dimensional electron gas when a film thickness of the semiconductor layer is decreased to around a Fermi wavelength of the carriers. Accordingly, the semiconductor device according to the present invention can have a larger resistance modulation, a high speed performance and a high driving performance. Also, a thin film thickness of the semiconductor layer enables to minimize remaining regions other than a region placed just under the third electrode. Therefore, a parasitic resistance or a parasitic resistance generated in the remaining regions can be reduced.

In addition to the formation of the semiconductor layer having a thin film thickness, the semiconductor device according to the present invention has a fourth electrode to limit a width of the transit region of the carriers to around the Fermi wavelength of the carriers. Accordingly, the transit region of the carriers is formed in a quantum wire structure (one dimensional electron system), and an elastic scattering of the carriers may be suppressed. Therefore, the mobility of the carriers may be improved. Also, after the energy of the carriers is quantized, selected carriers having a high energy can be injected into a region in which the conductive particles are dispersed. Accordingly, a semiconductor device which is proof against noises and is appropriate to an operation at a high temperature can be provided according to the present invention.

Also, in case where the transit direction of the carriers agrees with the film thickness direction of the semiconductor layer, a resonance tunnel barrier layer is provided outside the semiconductor layer to make some of the carriers pass though the resonant tunneling barrier layer according to a resonance tunnel effect. Therefore, the carriers can be supplied in the semiconductor layer. In detail, selected carriers which are quantized and are excited to an energy level agreeing with that of the resonant tunneling barrier layer pass through the resonant tunneling barrier layer according to the resonance tunnel effect. Therefore, the selected carriers having a high energy can be injected into the semiconductor layer in which the conductive particles are dispersed. Accordingly, a semiconductor device which operates in ultra high speed can be provided according to the present invention.

DETAILED DESCRIPTION OF THE PREFERRED EMBODIMENTS

Embodiments of the present invention are described with reference to drawings.

Figure 3A:
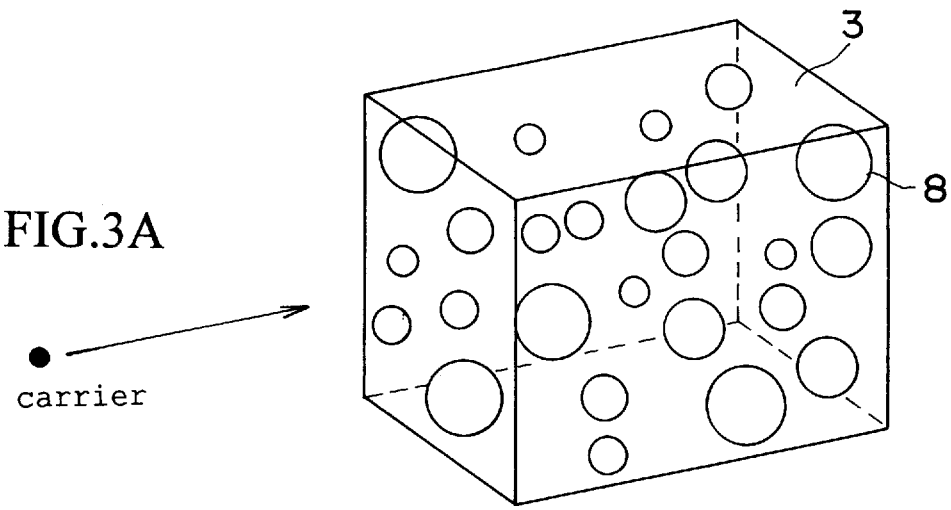
FIG. 3A is a diagonal view of a semiconductor layer in which conductive particles are dispersed according to embodiments of the present invention.
Figure 3B:
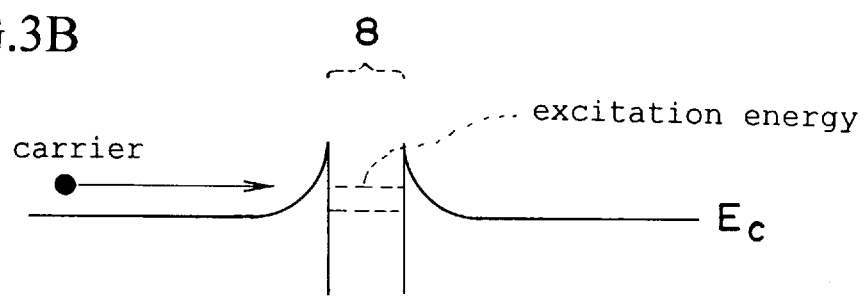
FIG. 3B is a typical view showing a scattering mechanism of carriers influenced by excitation levels in the conductive particle according to embodiments of the present invention.
Figure 3C:
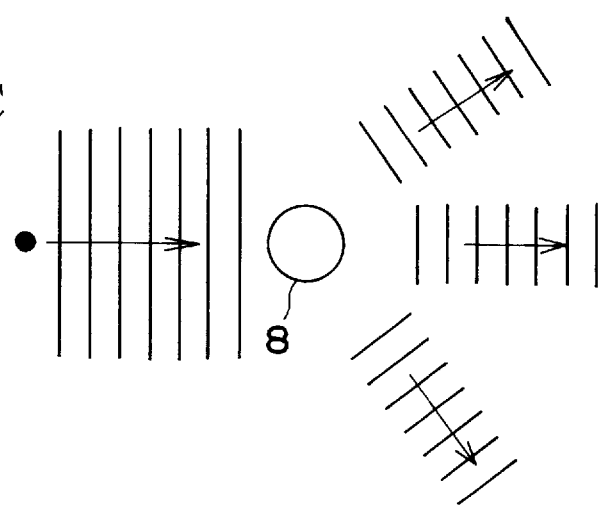
FIG. 3C is a typical view showing a state that a carrier is scattered by a conductive particle according to embodiments of the present invention.

(1) A configuration and an operational principle of a resistance modulation device with conductive particles according to embodiments of the present invention FIG. 3A is a diagonal view of a semiconductor layer 3 with metallic particles (or conductive particles) 8. FIG. 3B is a typical view showing a scattering mechanism of carriers influenced by an excitation level in the metallic particles 8, and FIG. 3C is a typical view showing a state that a carrier is scattered by a metallic particle 8.

A resistance (or conductance) of a semiconductor layer 3 depends on interaction between a group of conduction electrons (or carriers) of the semiconductor layer 3 and metallic particles 8. In particular, a resonance scattering phenomenon depending on excitation levels of the metallic particles 8 is important.

Figure 4:
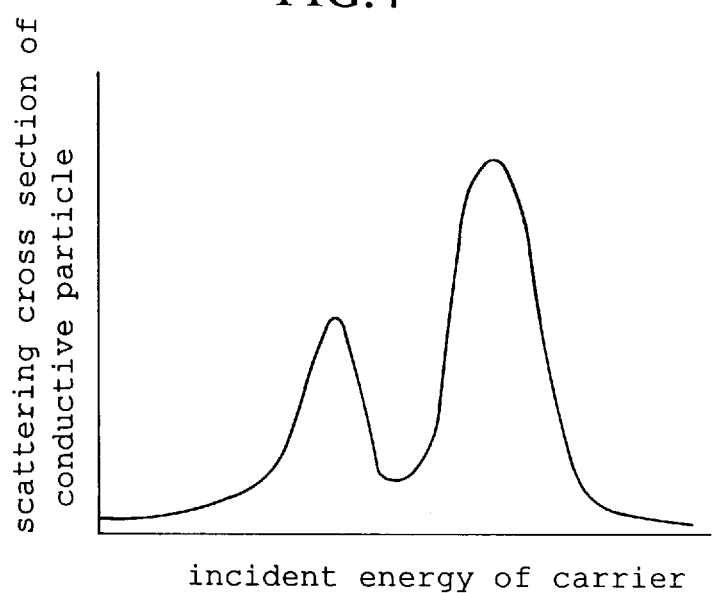
FIG. 4 is a characteristic view showing a relationship between an incident energy of a carrier and a scattering cross section of a conductive particle according to embodiments of the present invention.

As shown in FIG. 3A, the conduction electrons are accelerated by an electric field induced from the outside and pass through the semiconductor layer 3. In this case, some of the conduction electrons collide with the metallic particles 8. As shown in FIG. 3B, when an energy of a conduction electron is close to one of internal excitation levels of electrons, plasmons or phonons in a metallic particle 8, a resonance occurs. With this, as shown in FIG. 3C, a scattering probability is increased, and the resistance of the semiconductor layer 3 is increased. An example of relationship between an incident energy of the conduction electron and a scattering cross section of the metallic particle is shown in FIG. 4. Two peaks indicate two different energy levels in a quantized metallic particle 8.

Each of resonance energy widths in the peaks is inversely proportional to a life time of the excitation level. Accordingly, a plurality of resonance energy widths appropriate to various types of operations can be obtained by adopting a material of the metallic particle 8 and a size of the metallic particle 8 so as to be appropriate to a semiconductor device.

Also, in use of a plurality of excitation levels in a metallic particle 8, a plurality of resonance levels are obtained. Accordingly, a semiconductor device having more complicated functions can be obtained. As the excitation levels, ones of electrons in a metallic particle 8, ones of plasmons resulting from a collective motion of electrons existing in a metallic particle 8 or ones of phonons resulting from a shape vibration of a metallic particle 8 can be utilized.

As for the semiconductor layer 3 in which the metallic particles 8 are dispersed, when a kind of a semiconductor forming the layer 3, a density of impurities doped in the layer 3, a dimension and a size of the channel are adopted so as to be appropriate to the semiconductor device, the resonance scattering of the conduction electrons by the metallic particles 8 is effectively generated, and a range of the resistance modulation can be enlarged as much as possible.

Figure 1A:
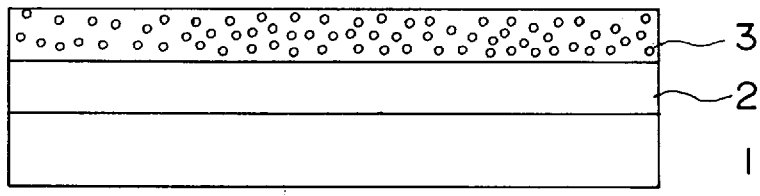
FIGS. 1A to 1F are cross sectional views showing a method of manufacturing a resistance modulation device with conductive particles according to a first embodiment of the present invention.
Figure 1B:
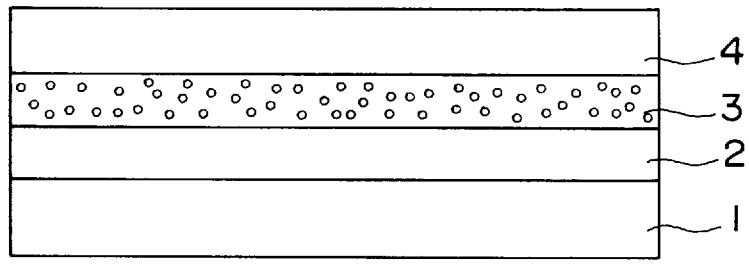
Figure 1C:
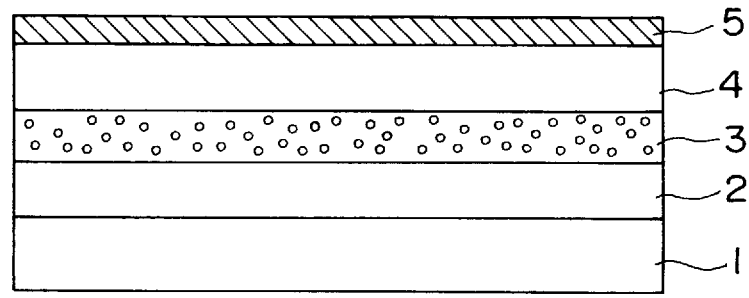
Figure 1D:
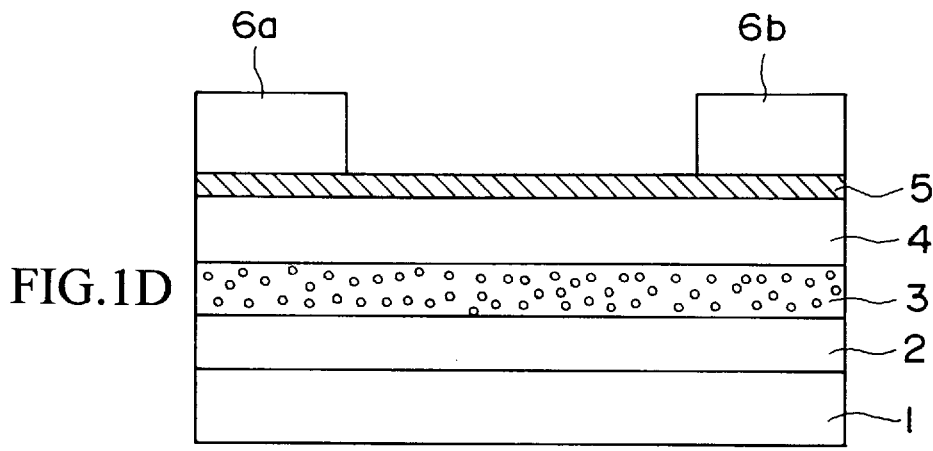
Figure 1E:
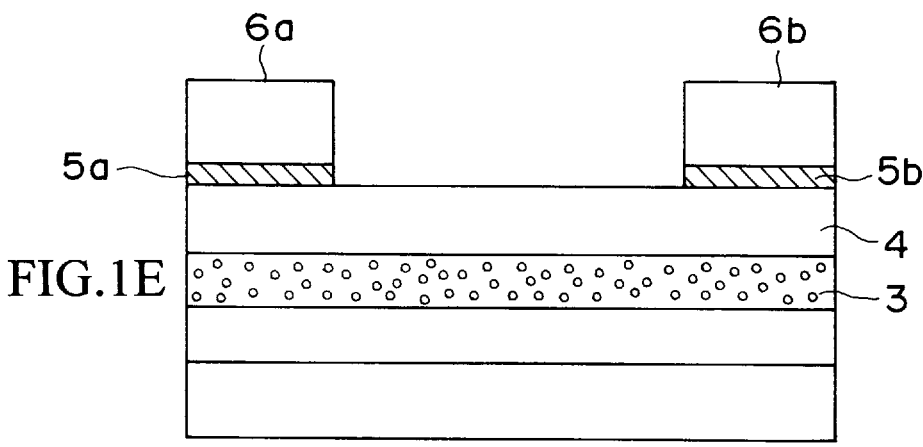
Figure 1F:
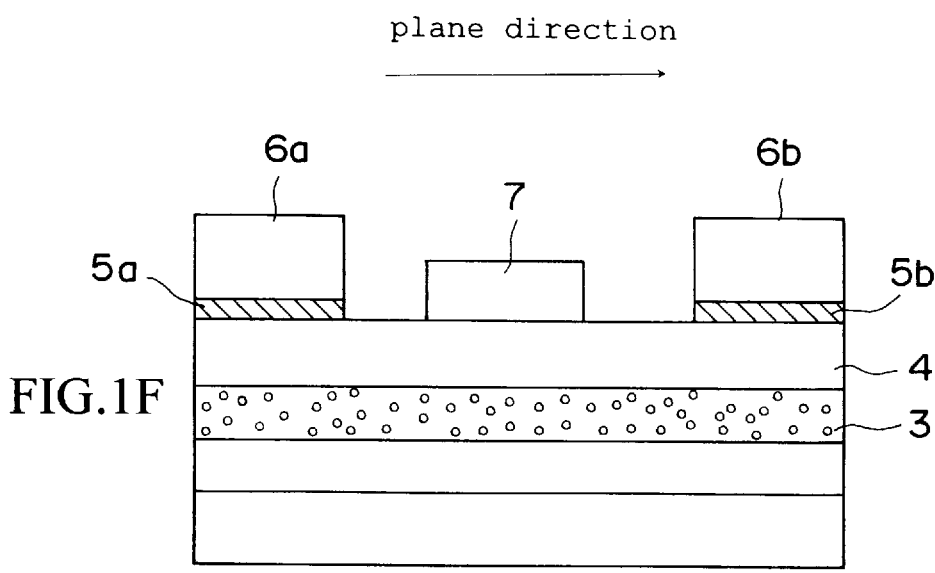

FIG. 1F shows a three-terminal device according to an embodiment as an example. In the three-terminal device, the semiconductor layer 3 formed on a semiconductor substrate, in which the metallic particles 8 are dispersed, is utilized as a channel (or a transit region of the carriers), a gate electrode (a third electrode) 7 is provided on a carrier supplying layer 4 placed on the channel to control a Fermi energy or an electric potential of the channel, and source and drain electrodes (or a first electrode and a second electrode) 6a, 6b is provided for the conduction electrons to pass through the channel from one side to the other side of the gate electrode 7.

In this example of the three-terminal device, a plane direction of the semiconductor layer 3 is set to agree with a transit direction of the conduction electrons, and the Fermi energy of the semiconductor layer 3 is changed by a gate voltage applied to the gate electrode 7. In this case, it is applicable that a quantum well layer be utilized as the semiconductor layer 3.

Any conductive impurity is not doped into the semiconductor layer 3, and conduction electrons are supplied from the carrier supplying layer 4 adjacent to the semiconductor layer 3 to the semiconductor layer 3.

In the above configuration of the three-terminal device, a gate voltage is applied to the gate electrode 7 on condition that a voltage is applied to the source and drain electrodes 6a and 6b, so that a Fermi energy of the semiconductor layer 3 is changed. When the Fermi energy is sufficiently close to one of excitation levels in the metallic particles 8, conduction electrons passing through the semiconductor layer 3 at an energy almost the same as the Fermi energy are resonantly scattered by the metallic particles. Therefore, a resistance of the semiconductor layer 3 is rapidly increased by high scattering probability of the conduction electrons. Accordingly, the resistance of the semiconductor layer 3 can be changed by adjusting the gate voltage. In other words, a resistance modulation can be obtained.

In this case, the narrower a resonance width of the conduction electrons, the more acute the resistance modulation. As a result, a transconductance of the three-terminal device can be increased. Accordingly, a driving performance, an operational speed and a consumed electric power in the three-terminal device can be improved.

As a modification of the above embodiment, when the gate electrode 7 is, for example, placed sufficiently close to the metallic particles 8, the number of electrons existing in each of the metallic particles 8 can be changed. For example, a film thickness of the carrier supplying layer 4 is made thin. In this case, a channel resistance corresponding to the number of electrons can be obtained on condition that the gate voltage is adjusted. Accordingly, the semiconductor device can obtain a more complicated function.

As another modification of the above embodiment, it is possible to use a phenomenon that the thickness of a depletion layer naturally formed around the metallic particles 8 varies with the gate voltage, in which no resonance scattering is utilized. That is, a size of each of the metallic particles including the depletion layer is changed by the gate voltage, and a width of a carrier transit region therebetween is narrowed or widened. Therefore, the resistance of the semiconductor layer 3 can be changed.

Figure 5A:
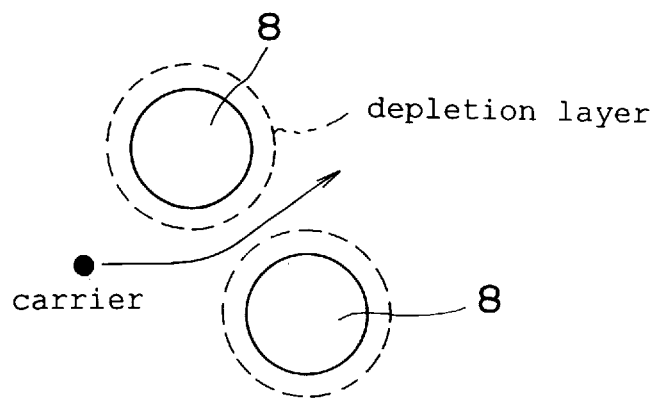
FIGS. 5A and 5B are respectively a typical view showing a resistance modulation which utilizes the variation of a width of depletion layers formed around the conductive particles according to embodiments of the present invention.
Figure 5B:
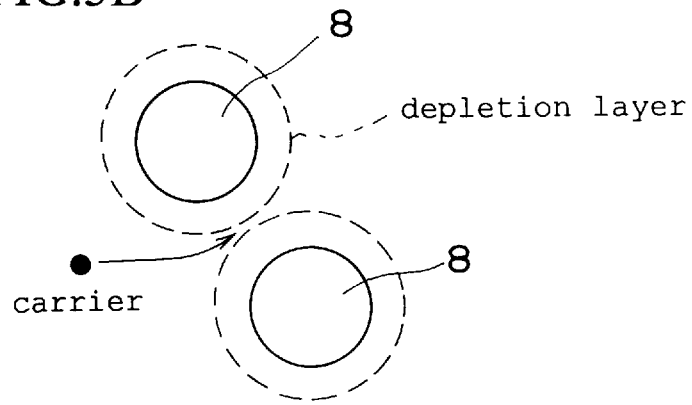

This results from the followings. The number of conduction electrons in the semiconductor layer 3 changes as the electric potential or the Fermi energy therein changes, so that the width of the depletion layer formed around each of the conductive particles changes. For example, as shown in FIG. 5A, as the number of conduction electrons is increased, the width of the depletion layer is narrowed. Therefore, a flowing path of each of the conduction electrons is widened, and the resistance of the channel is lowered. In contrast, as shown in FIG. 5B, as the number of conduction electrons is decreased, the width of the depletion layer is widened, and a depletion layer of a metallic particle comes into contact with a depletion layer of a peripheral metallic particle. Therefore, a flowing path of each of the conduction electrons is narrowed, and the resistance of the channel is increased. The control of the channel resistance is more effective when the density of the conductive particles (or metallic particles) is high.

As for the size of the channel, for example, when a length of the channel is set to be ten or more times a Fermi wavelength (about 100 angstroms) of the conduction electrons, a scattering modulation peculiar to a low-dimensional channel is prevented. Therefore, the semiconductor device can be easily designed.

In addition, when a width and/or a thickness of the channel in the semiconductor layer 3 are set to be about ten times the Fermi wavelength of the conduction electrons according to a high-graded crystal growth technique and a fine processing technique, a two-dimensional electron gas (2DEG) can be generated, or a quantum wire structure can be formed. With this, an elastic scattering of each of the conduction electrons can be suppressed, the mobility of the conduction electrons can be increased, and a higher resistance modulation, a higher speed performance and a higher driving performance can be obtained. Also, because a region other than a channel region placed just under the gate electrode 7 can be minified, a parasitic resistance and a parasitic capacitance in the semiconductor device which normally arouse a problem can be reduced.

Also, the uniformity of the sizes of the metallic particles 8 dispersed in the semiconductor layer 3 influences on the acuteness of the resonance. On the contrary, the unevenness of the sizes of the metallic particles 8 damages the acuteness of the resonance. Therefore, it is preferred that the dispersion of the sizes of the metallic particles 8 is suppressed so that the resonance width is lower than the indeterminacy (that is, $k_B*T$, $k_B$ is a Boltzmann's constant) of the Fermi energy at an operational temperature of the semiconductor device. For example, when a metal As precipitated in GaAs or InGaAs is utilized as the material of the metallic particles 8, the sizes of the metallic particles 8 dispersed in the channel of the semiconductor layer 3 can be made uniform, and the resonance can be sharpened.

Figure 9:
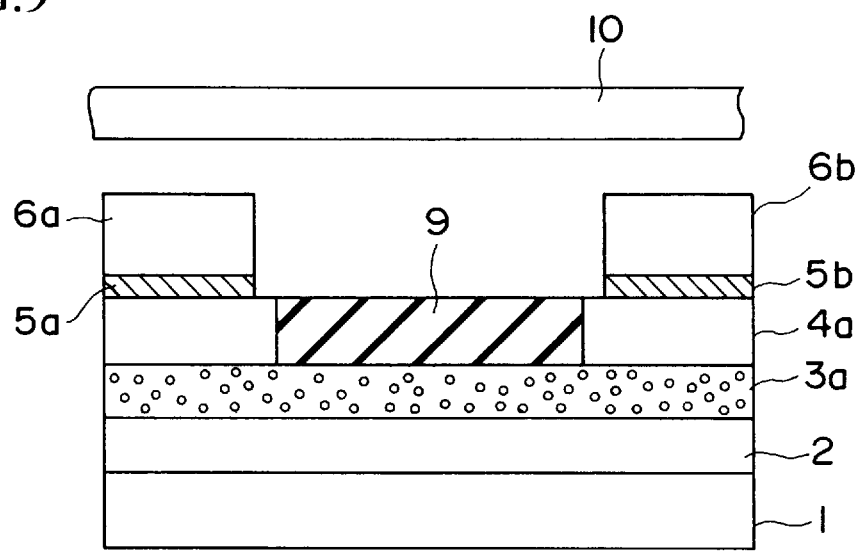
FIG. 9 is a cross sectional view showing a resistance modulation device according to a fifth embodiment of the present invention.

In the above embodiment, the three-terminal device having the gate electrode 7 placed just above the channel is described as the semiconductor device. However, as a modification of the above embodiment, a semiconductor layer in which metallic particles 8a are dispersed is utilized as a channel without using the gate electrode 7, and a two-terminal device having the semiconductor layer can be utilized as a magnetic head in a magnetic recording device. The semiconductor layer having conduction electrons can be, as shown in FIG. 9, concretized by a semiconductor layer 3a in which impurities are doped to supply conduction electrons to the semiconductor layer 3a. Also, as shown in FIG. 1F, it can be concretized by the semiconductor layer 3 in which any impurity is not doped. In this case, a carrier supplying layer 4 is provided outside the semiconductor layer 3.

In the two-terminal device of FIG. 9, a magnetic field generating means 10 of a coil or a magnetic recording medium or the like is utilized as a means for varying a resistance of the channel layer 3a (or the semiconductor layer 3a), in place of the gate electrode 7 (or the third electrode), and a magnetic field is used as an input signal.

In detail, a Landau level changes in accordance with the intensity of the magnetic field generated by the magnetic field generating means 10, and energy levels or excitation spectra of electrons, plasmons or phonons in the metallic particles 8a change in association with a change of the Landau level or independently to that change. As a result, a resonance condition changes, and this results in a change of a scattering probability of the conduction electrons. With this, the change of the magnetic field can be detected through a change of the resistance or conductance of the channel layer 3a.

Because a magnetic field detecting mechanism described above is the same as a switching mechanism in a conventional semiconductor device, the detecting speed is fundamentally and greatly higher than that in a conventional one. Also, when a resonance is narrowed in width and is sharpened, even a slight change of the magnetic field can be detected. Therefore, the sensitivity of the semiconductor device concretized by the two-terminal device is enhanced.

Also, in case where a gate electrode is provided for the two-terminal device, the sensitivity of the magnetic head and an offset in the magnetic head can be adjusted at a real time.

In the above embodiment, the impurities exist in the semiconductor as a donor. In other words, the carriers are concretized by the conduction electrons. However, as a modification of the above embodiment, in case where the impurities exist in the semiconductor as an acceptor, in other words, the carriers are concretized by holes, the same effects can be obtained.

Also, the metallic arsenic is utilized as conductive particles dispersed. However, other metals can be utilized. Also, a semimetal other than metals, superconductive substance, a semiconductor(including one with magnetic impurities or magnetic semiconductor), or magnetic metal(including metal with magnetic impurities) can be used to obtain the same effects.

Figure 2:
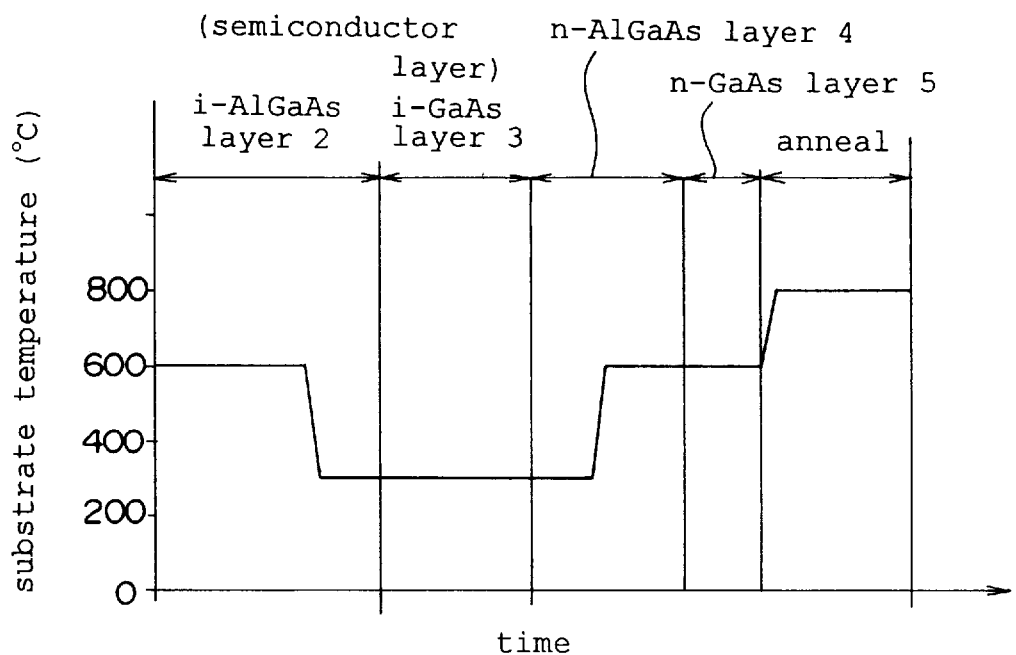
FIG. 2 is a timing chart of the formation of films in the resistance modulation device according to the first embodiment of the present invention.

(2) A method of manufacturing the resistance modulation device with conductive particles according to the first embodiment FIGS. 1A to 1F are cross sectional views showing a method of manufacturing the resistance modulation device with conductive particles shown in FIG. 1F. FIG. 2 is a timing chart of the formation of films in the resistance modulation device.

As shown in FIG. 1A, a GaAs substrate 1 having a semi-insulating performance is maintained at a temperature of about 600° C., and an non-doped i-AlGaAs layer 2 is formed on the GaAs substrate 1 according to a molecular beam epitaxy (MBE) method, a gas source MBE (GSMBE) method or a metal organic MBE (MOMBE) method. Thereafter, the temperature of the substrate 1 is decreased to a value ranging from 200° to 300° C. before a thickness of the i-AlGaAs layer 2 reaches a prescribed film thickness, and the formation of the i-AlGaAs layer 2 is continued. After a prescribed time, the i-AlGaAs layer 2 having a film thickness of about 300 nm is formed.

Thereafter, an i-GaAs layer (or a semiconductor layer) 3 having a film thickness of about 10 nm is formed on the i-AlGaAs layer 2 on condition that the substrate 1 is maintained at the temperature ranging from 200° to 300° C.

Subsequently, as shown in FIG. 1B, an n-$Al_{0.2}Ga_{0.8}As$ layer 4 in which Si is doped at a density of about $3\times10^{17}$ $cm^{-3}$ is formed on the i-GaAs layer 3 on condition that the substrate 1 is maintained at the temperature ranging from 200° to 300° C. When a thickness of the n-$Al_{0.2}Ga_{0.8}As$ layer 4 reaches a prescribed film thickness, the temperature of the GaAs substrate 1 is increased to about 600° C., and the film formation is continued until the n-$Al_{0.2}Ga_{0.8}As$ layer 4 having a film thickness of 50 nm is formed.

Thereafter, as shown in FIG. 1C, an n-GaAs layer 5 in which Si is doped at a density of about $1.5\times10^{18}$ $cm^{-3}$ is formed at a film thickness of 10 nm on the n-$Al_{0.2}Ga_{0.8}As$ layer 4.

Subsequently, the layers are annealed for a prescribed anneal time at an anneal temperature ranging from 700° to 800° C. according to a ramp anneal method. Therefore, metallic As particles (or conductive particles) are precipitated in the i-GaAs layer 3 having the smallest band gap of a heterojunction, which is formed at a low temperature. In this case, sizes of the metallic As particles 8 and a dispersion density of the metallic As particles 8 can be controlled by adjusting the anneal temperature and the anneal time. As the anneal temperature is heightened, the dispersion density of the metallic As particles 8 is increased, and the sizes of the metallic As particles 8 are enlarged. Therefore, an operator can adjust the dispersion density and the sizes to be appropriate to a type of the resistance modulation device. In this embodiment, the sizes of the metallic As particles 8 are set to a range from 3 to 20 nm, and the dispersion density of the metallic As particles 8 is set to about 1%.

Thereafter, a resist film is formed on the n-GaAs layer 5 and is patterned, and a resist mask (not shown) having a width of about 6 $\mu$m is formed in a center portion thereon.

Subsequently, as shown in FIG. 1D, after an AuGe/Ni film is formed at a film thickness of about 400 nm, the resist mask is removed, and source and drain electrodes 6a, 6b are formed according to a lift-off. In this case, a distance between the source and drain electrodes 6a, 6b is 6 $\mu$m.

Thereafter, as shown in FIG. 1E, a part of the n-GaAs layer 5 placed at a particular position at which a gate electrode 7 is expected to be formed is removed according to a wet etching by using the source and drain electrodes 6a, 6b as masks to expose the n-$Al_{0.2}Ga_{0.8}As$ layer 4. In this case, the remaining part of n-GaAs layers 5a, 5b serves as source and drain contact layers.

After a resist film is formed over the entire surfaces of the n-$Al_{0.2}Ga_{0.8}As$ layer 4 and the source and drain electrodes 6a, 6b, the resist film is patterned, and a resist mask (not shown) having an opening almost placed at a center between the source and drain electrodes 6a, 6b is formed. A width of the opening is 2 $\mu$m.

Thereafter, as shown in FIG. 1F, after an Al film having a film thickness of 400 nm is formed over the entire surfaces of the resist mask and the n-$Al_{0.2}Ga_{0.8}As$ layer 4, the resist mask is removed, and a gate electrode 7 is formed on the n-$Al_{0.2}Ga_{0.8}As$ layer 4 according to the lift-off. Therefore, the resistance modulation device is manufactured. In this case, the gate electrode 7 has a width of 2 $\mu$m, and distances between the gate electrode 7 and the source and drain electrodes 6a, 6b are about 2 μm together.

Besides, the gate electrode 7 is not necessarily required. In this case, the resistance of the channel is controlled by changing the intensity of the magnetic field generated by the magnetic recording medium, in place of the gate electrode 7. Therefore, the resistance modulation device can be utilized as a magnetic head.

(3) The configuration of the resistance modulation device with the conductive particles according to second to seventh embodiments of the present invention.

(A) A second embodiment

Figure 6A:
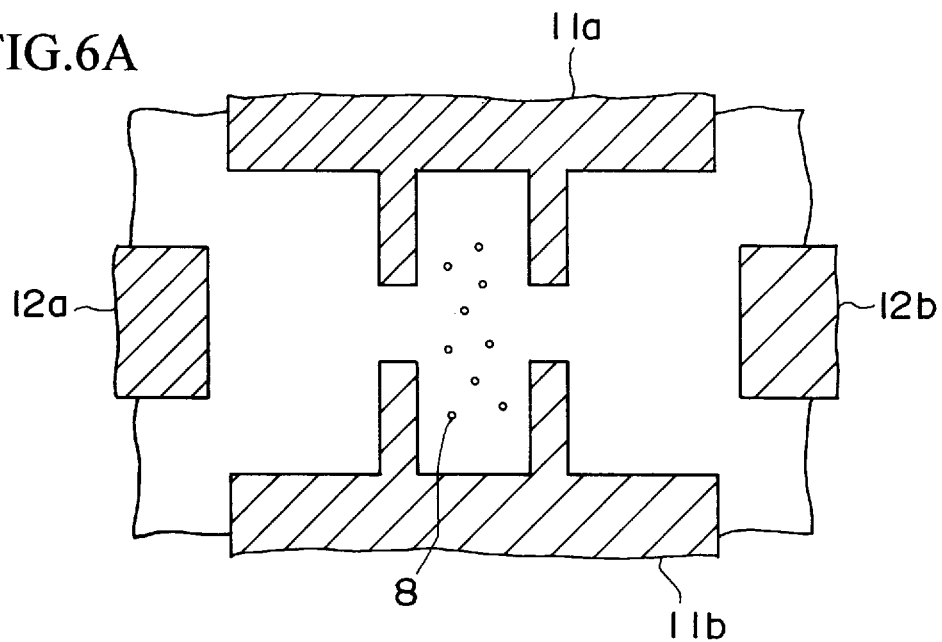
FIG. 6A is a plan view showing a resistance modulation device according to a second embodiment of the present invention.
Figure 6B:
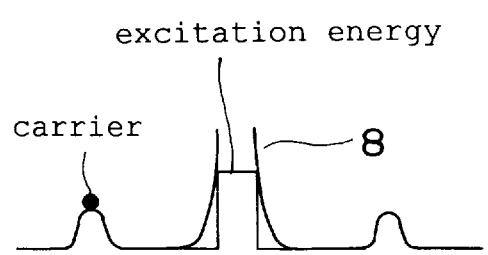
FIG. 6B is a typical view showing a scattering mechanism of carriers influenced by excitation levels in the conductive particle according to the second embodiment of the present invention.
Figure 6B:
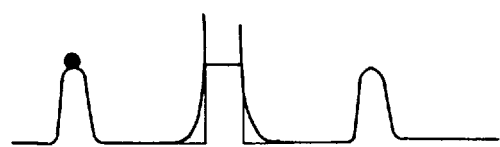

FIG. 6A is a plan view showing the configuration of a resistance modulation device with conductive particles according to a second embodiment of the present invention, and FIG. 6B shows energy band diagrams in a conductive particle. Upper and lower energy band diagrams in FIG. 6B correspond to a condition that any gate voltage is not applied to a gate electrode and another condition that a gate voltage is applied thereto, respectively.

In this embodiment, as for a layer configuration along a film thickness direction of the semiconductor layer 3, a plane direction along a surface of the semiconductor layer 3 in which the conductive particles 8 are dispersed agrees with a transit direction of the carriers, in the same manner as in the first embodiment shown in FIG. 1F. A transit region of the carriers is defined as the channel. Also, the semiconductor layer 3 is formed of the non-doped i-GaAs layer in which the metallic As particles (or the conductive particles) are dispersed and is placed on the i-AlGaAs layer 2 placed on the semi-insulating GaAs substrate 1. Also, the n-AlGaAs layer 4 functioning as the carrier supplying layer is formed on the semiconductor layer 3.

As for a plane configuration, as shown in FIG. 6A, gate electrodes (or the third electrode) 11a, 11b formed on the n-AlGaAs layer 4 are arranged along the channel between source and drain electrodes (or a first electrode and a second electrode) 12a and 12b and face each other with the channel. The source and drain electrodes 12a, 12b are formed at a prescribed interval on the n-AlGaAs layer 4 through the n-GaAs layers 5a, 5b functioning as the source and drain contact layers, and the gate electrodes 11a and 11b are formed on the n-AlGaAs layer 4 placed between the source and drain electrodes 12a, 12b.

Also, the gate electrodes 11a and 11b opposite to each other respectively have two juts formed in a narrow belt shape. The juts of the gate electrode 11a are positioned to be opposed to those of the gate electrode 11b, and the juts of each of the gate electrodes 11a and 11b are at an interval of 400 nm. The carriers pass through the channel surrounded by the juts of the gate electrodes 11a and 11b from the source electrode 12a to the drain electrode 12b or in a reverse direction. Also, as shown in FIG. 6B, the number of modes in the channel and an average number of the electrons (or the carriers) in the channel changes in association with a change of a gate voltage applied to the gate electrodes (or the third electrode) 11a and 11b. With this, a probability of the resonance scattering in the channel changes, and this leads to a change of the resistance of the channel layer 3.

Accordingly, the resistance of the channel can be controlled by adjusting the gate voltage.

(B) Third embodiment

Figure 7A:
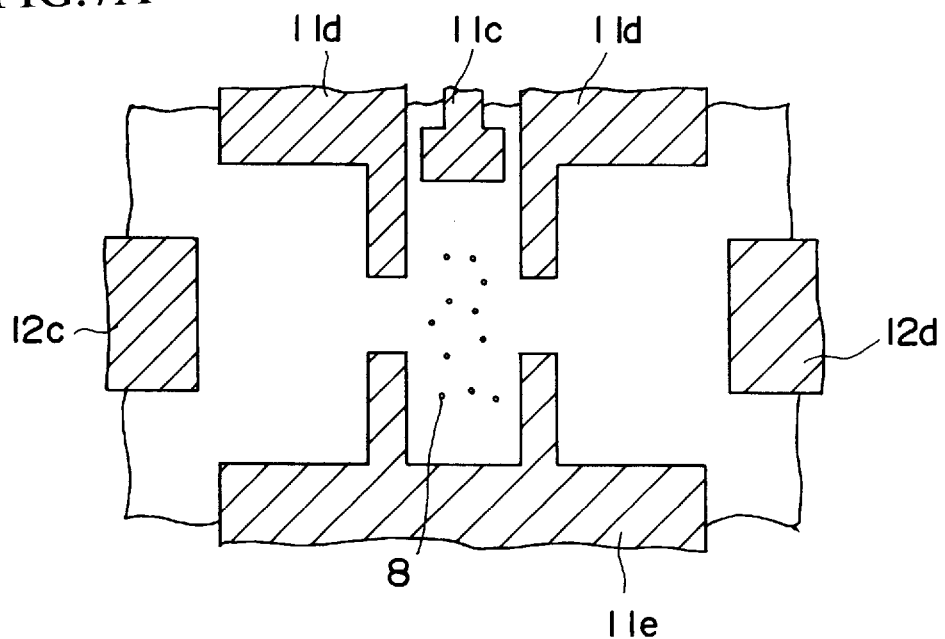
FIG. 7A is a plan view showing a resistance modulation device according to a third embodiment of the present invention.
Figure 7B:
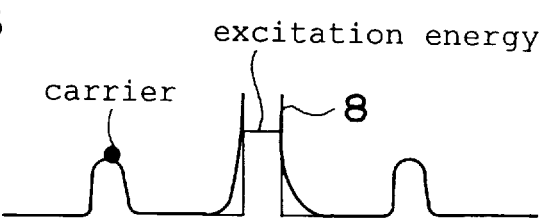
FIG. 7B is a typical view showing a scattering mechanism of carriers influenced by excitation levels in the conductive particle according to the third embodiment of the present invention.
Figure 7B:
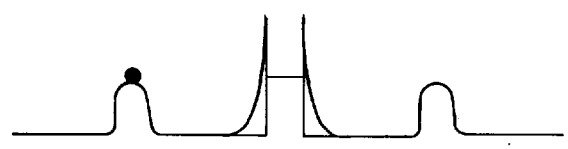

FIG. 7A is a plan view showing a resistance modulation device with conductive particles according to a third embodiment of the present invention, and FIG. 7B shows energy band diagrams in a conductive particle. Upper and lower energy band diagrams in FIG. 7B corresponds to a condition that any gate voltage is not applied to a gate electrode and another condition that a gate voltage is applied thereto, respectively.

In this embodiment, a plane direction of the semiconductor layer 3 in which the conductive particles 8 are dispersed agrees with a transit direction of the carriers, and a transit region of the carriers is defined as a channel. Also, a laminated structure along a film thickness direction of the semiconductor layer 3 is the same as in the first embodiment shown in FIG. 1F.

In contrast, a plane shape of the resistance modulation device is similar to that in the second embodiment. That is, as shown in FIG. 7A, gate electrodes 11d, 11e are formed between source and drain electrodes (or a first electrode and a second electrode) 12c, 12d. The gate electrodes 11d, 11e according to the third embodiment functions as a pair of dummy electrodes to which a constant voltage is applied. A different point from the second embodiment is as follows. One dummy electrode 11d is cut off at a center position between two juts of, and a gate electrode (or a third electrode) 11c electrically separated from the dummy electrode lid is provided between two juts.

In the above configuration, as shown in FIG. 7B, an electric potential of the channel mainly changes with a gate electrode applied to the gate electrode 11C. Also, a potential energy level (or an excitation level) in each of the conductive particles 8 changes in association with the electric potential of the channel. Thereafter, when the potential energy level sufficiently approaches an energy of each of the conduction electrons (or the carriers), a probability of the resonance scattering is heightened, and the resistance of the channel is increased. In this case, an energy level of an electron in a conductive particle 8, an energy level of a plasmon in a conductive particle 8 or an energy level of a phonon in a conductive particle 8 can be utilized as the potential energy level.

Also, because a Coulomb energy of each of the conduction electrons at a rectangular region surrounded by the juts of the gate electrodes 11d, 11e changes, the resistance of the channel changes.

Accordingly, the resistance of the channel can be controlled by adjusting the gate voltage applied to the gate electrode 11c.

(C) Fourth embodiment

Figure 8A:
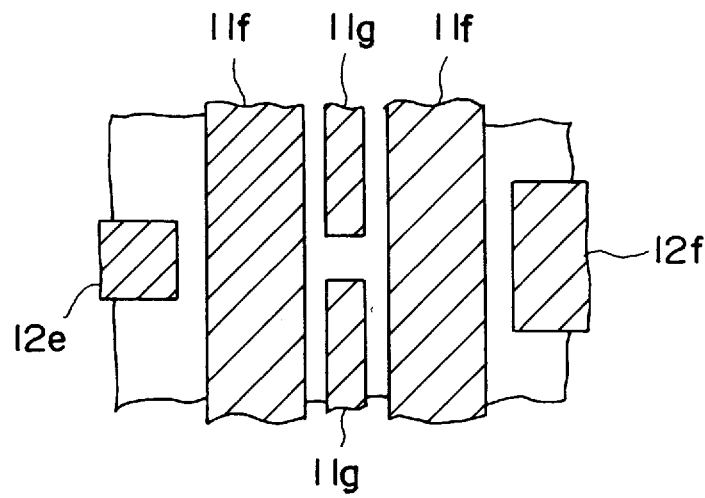
FIG. 8A is a plan view showing a resistance modulation device according to a fourth embodiment of the present invention.
Figure 8B:
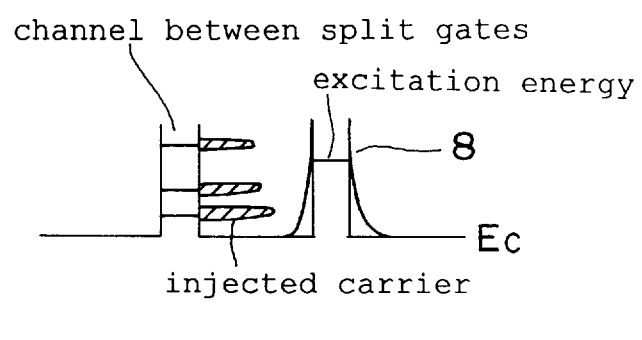
FIG. 8B is a typical view showing a scattering mechanism of carriers influenced by excitation levels in the conductive particle according to the fourth embodiment of the present invention.
Figure 8B:
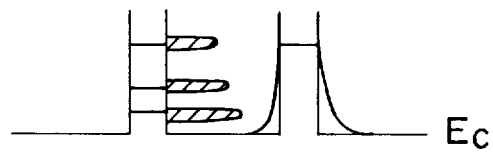
Figure 8B:
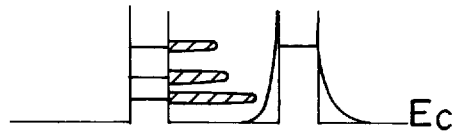

FIG. 8A is a plan view showing a resistance modulation device with conductive particles according to a fourth embodiment of the present invention, and in FIG. 8B are shown energy band diagrams in a conductive particle. Upper, middle and lower energy band diagrams in FIG. 8B respectively correspond to a condition that any gate voltage is not applied to a gate electrode, another two conditions that a gate voltage is applied thereto.

In this embodiment, a plane direction of the semiconductor layer 3 in which the conductive particles 8 are dispersed agrees with a transit direction of the carriers, and a transit region of the carriers is defined as a channel. Also, the conductive particles 8 are dispersed in the semiconductor layer 3 placed at least on a side of a drain electrode 12f, and it is not necessarily required to disperse the conductive particles 8 in the semiconductor layer 3 placed in the other side. Also, a laminated structure along a film thickness direction of the semiconductor layer 3 is the same as in the first embodiment shown in FIG. 1F.

In contrast, a plane configuration in the fourth embodiment differs from that in the third embodiment. That is, as shown in FIG. 8A, a pair of gate electrodes (or a third electrode) 11f are provided between source and drain electrodes (or a first electrode and a second electrode) 12e, 12f to change the potential and a Fermi energy of the channel, or to change an excitation level in a conductive particle 8. In addition, a pair of split gate electrodes (or a fourth electrode) 11g respectively formed in a narrow belt shape are provided between the gate electrodes 11f to change a width of the channel. The split gate electrodes 11g face each other through the channel. The gate electrodes 11f are electrically separated from the split gate electrodes 11g.

In the above configuration, because the potential of a narrowed channel placed between the split gate electrodes 11g is lower than a potential energy level of the semiconductor layer 3 placed just under the split gate electrodes 11g, conduction electrons (or carriers) mainly pass through the narrowed channel. In this case, as an upper energy band diagram in FIG. 8B is shown, the potential at the narrowed channel placed between the split gate electrodes 11g is quantized to separate the potential to a plurality of potential levels. Therefore, when a body of conduction electrons passes through the narrowed channel, the body of conduction electrons is separated into a plurality of groups of conduction electrons having different energy levels corresponding to the potential levels quantized. Thereafter, the groups of conduction electrons are injected into the channel in which the conductive particles 8 are dispersed.

Therefore, as a middle energy band diagram in FIG. 8B is shown, when the excitation level in a conductive particle 8 is adjusted, a particular group of conduction electrons having a particular energy level can be selected, and the resonance scattering between the particular group of conduction electrons and the conductive particle 8 can occur. Also, as a lower energy band diagram in FIG. 8B is shown, the particular energy level in the particular group of conduction electrons can be changed by changing an energy level of the narrowed channel so as to make the particular energy level agree with the excitation level in the conductive particle 8.

Accordingly, because various types of resonance scattering between the particular group of conduction electrons and the conductive particle 8 can be generated by appropriately controlling a gate voltage applied to the gate electrodes 11f and 11g, the resistance of the channel can be arbitrarily controlled.

In the fourth embodiment, not only the split gate electrodes 11g but also the gate electrodes 11f are utilized. However, because the resistance modulation device according to the fourth embodiment can be operated by using only the split gate electrodes 11g, the gate electrodes 11f are not necessarily required.

(D) Fifth embodiment

FIG. 9 is a cross sectional view showing a resistance modulation device with conductive particles according to a fifth embodiment of the present invention. A resistance modulation device according to the fifth embodiment is generally useful for a magnetic sensor and in particular for a magnetic head.

In this embodiment, as shown in FIG. 9, a plane direction of an n-GaAs layer (or a semiconductor layer) 3a, in which the conductive particles 8 are dispersed and Si (or an impurity) is doped to supply conduction electrons (or carriers), agrees with a transit direction of the carriers.

Also, as for a laminated structure along a film thickness direction of the semiconductor layer 3a, a source electrode 6a and a drain electrode 6b are formed on the n-GaAs layer 3a through an n-AlGaAs layer 4a and n-GaAs layers 5a and 5b, in the same manner as in the first embodiment. A different point from the first embodiment is as follows. Any gate electrode is not formed on a central portion of the n-GaAs layer 3a placed between the source electrode 6a and the drain electrode 6b. However, a protective insulating film 9 is formed on the central portion of the n-GaAs layer 3a. Also, in place of a gate electrode (or a third electrode), a magnetic recording medium (or a magnetic field generating means) 10 is placed above a channel positioned between the source electrode 6a and the drain electrode 6b to generate a magnetic field penetrating through the channel. Also, except for the gate electrode, a plane configuration of the resistance modulation device is the same as in the first embodiment.

In the above configuration of the resistance modulation device (or the semiconductor device), an excitation level in a conductive particle 8 changes as the magnetic field changes, and the resonance scattering between the conductive particle 8 and a conduction electron with an energy agreeing with the excitation level thereof is generated. Accordingly, the resistance of the channel can be controlled.

Also, the number of electrons in the conductive particle 8 changes as the magnetic field changes. With this, since a probability of the resonance scattering changes, the resistance of the channel can be also controlled.

In this case, an excitation level of an electron occurring with the occurrence of the Landau level, an excitation level of a plasmon, an excitation level of a phonon or the like can be used as the excitation level in the conductive particle 8 which changes as the magnetic field changes.

(E) Sixth embodiment

Figure 10A:
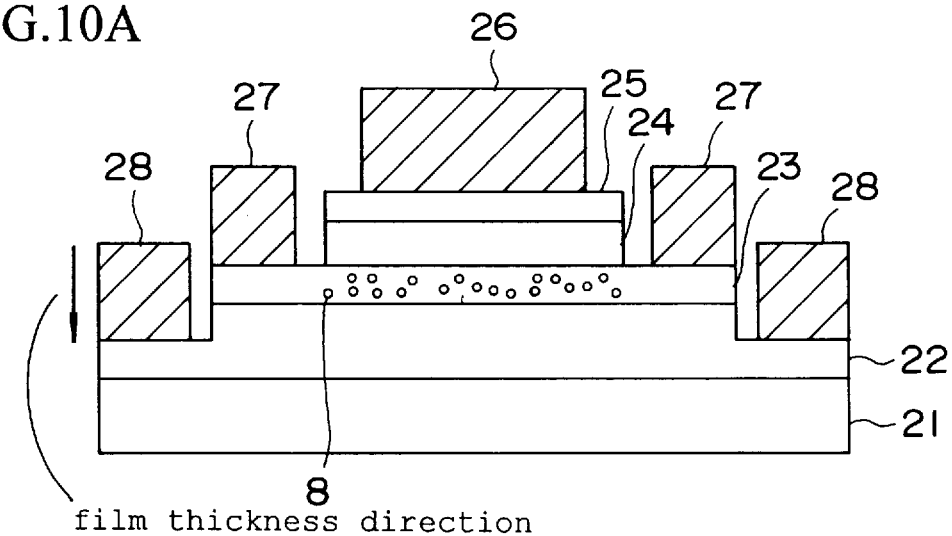
FIG. 10A is a cross sectional view showing a resistance modulation device according to a sixth embodiment of the present invention.
Figure 10B:
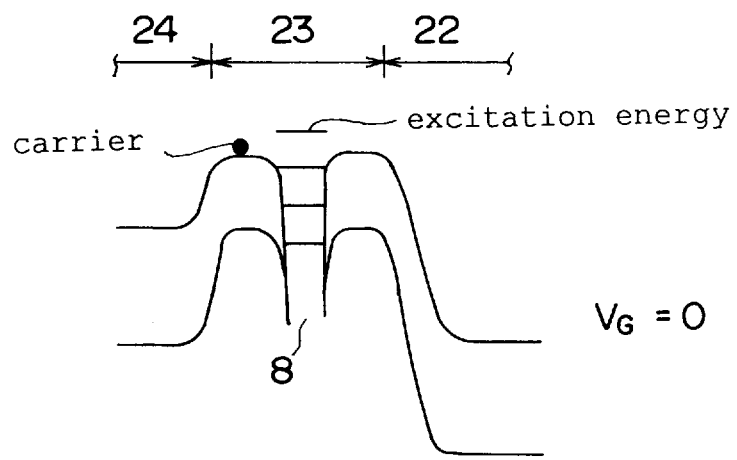
FIG. 10B is a typical view showing a scattering mechanism of carriers influenced by excitation levels in the conductive particle according to the sixth embodiment of the present invention.
Figure 10B:
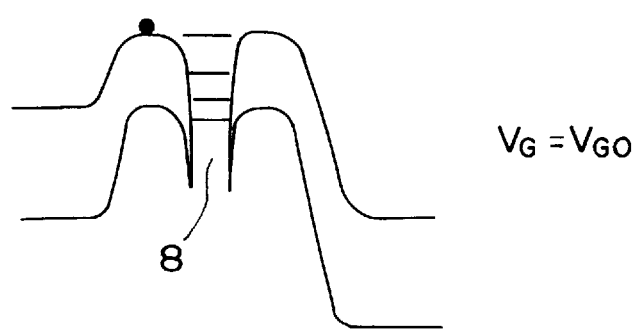

FIG. 10A is a cross sectional view showing a resistance modulation device with conductive particles according to a sixth embodiment of the present invention, and FIG. 10B shows energy band diagrams. An upper energy band diagram in FIG. 10B corresponds to a condition that any gate voltage (VG=0) is not applied to a gate electrode, and a lower energy band diagram corresponds to another condition that a gate voltage (VG=VGO) is applied to the gate electrode.

In this embodiment, as shown in FIG. 10A, a film thickness direction of a semiconductor layer 23 in which the conductive particles 8 are dispersed agrees with a transit direction of the carriers. Also, a pair of gate electrodes (or a third electrode) 27 connected with the semiconductor layer 23 are provided to control the potential and Fermi energy of this layer 23, or to control an excitation level in each of the conductive particles 8.

In FIG. 10A, 21 denotes a semi-insulating GaAs substrate, 22 denotes a drain layer which is placed on the semi-insulating GaAs substrate 21 and is formed of an n-AlGaAs layer, and 23 denotes the semiconductor layer 23 which is placed on the drain layer 22 and is formed of an i-GaAs layer functioning as a channel layer. In this case, an n-GaAs layer can be used as the semiconductor layer 23. Also, 24 denotes a source layer 24 which is placed on the semiconductor layer 23 and is formed of an n-AlGaAs layer, and 25 denotes a source contact layer which is placed on the source layer 24 and is formed of an n-GaAs layer. In addition, 26 denotes a source electrode (or a first electrode) placed on the source contact layer 25, 27 denotes a gate electrode (or a third electrode) connected to the semiconductor layer 23, and 28 denotes a drain electrode (or a second electrode) 28 connected to the drain layer 22.

In the above configuration of the resistance modulation device (or the semiconductor device), as shown in FIG. 10B, a conduction electron (or a carrier) having an energy equal to the Fermi energy is supplied from the source layer 24 and is injected into the channel layer (or the semiconductor layer) 23 in which the conductive particles 8 are dispersed.

Also, the excitation level in each of the conductive particles 8 is changed, and the resonance scattering between a conductive particle 8 and the conduction electron is generated. Accordingly, the resistance of the channel layer 23 can be controlled.

Besides, the resistance can be controlled by means of varing a width of a depletion layer around a conductive particle 8. In this structure, a resonant tunneling via the levels of a conductive particle is also possible.

(F) Seventh embodiment

Figure 11A:
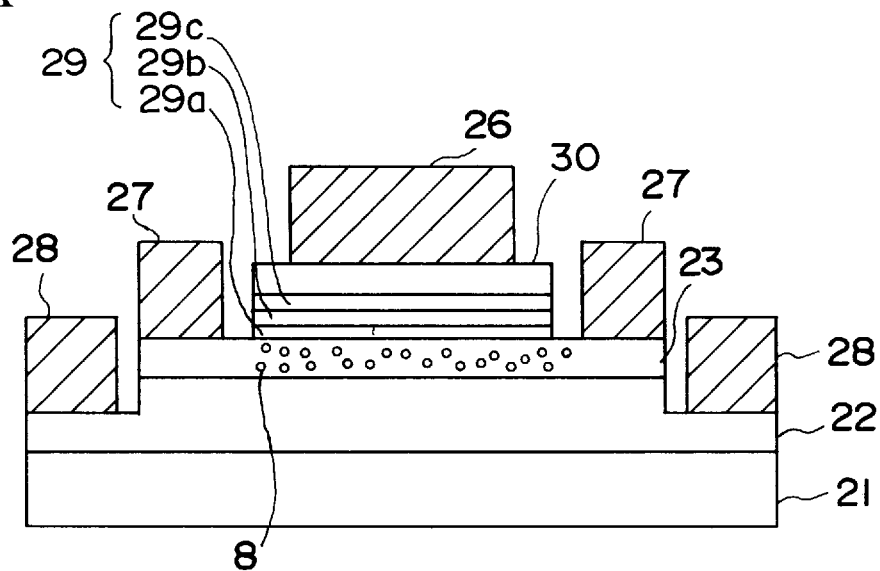
FIG. 11A is a cross sectional view showing a resistance modulation device according to a seventh embodiment of the present invention.
Figure 11B:
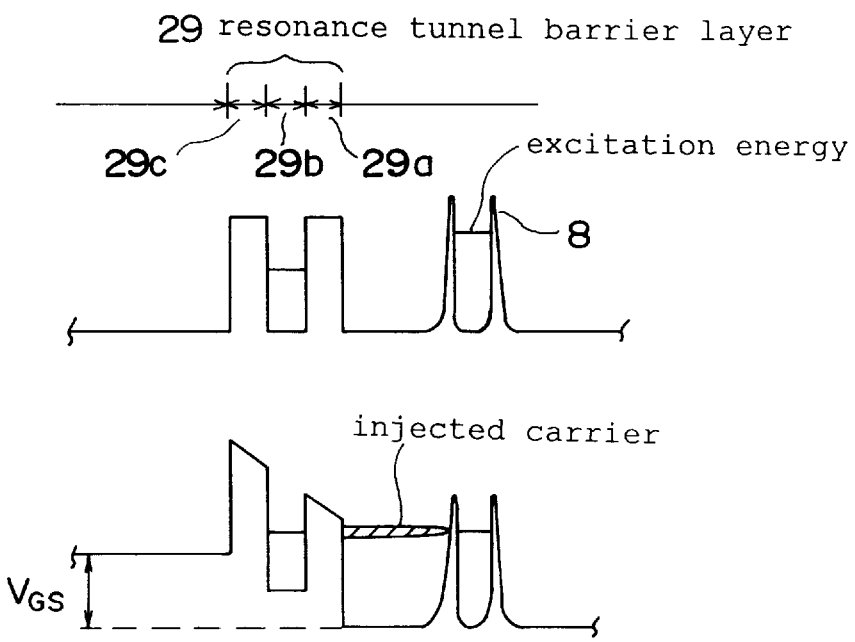
FIG. 11B is a typical view showing a scattering mechanism of carriers influenced by excitation levels in the conductive particle according to the seventh embodiment of the present invention.

FIG. 11A is a cross sectional view showing a resistance modulation device with conductive particles according to a seventh embodiment of the present invention, and in FIG. 11B are shown energy band diagrams in a conductive particle. An upper energy band diagram in FIG. 11B corresponds to a condition that any gate voltage (VG=0) is not applied to a gate electrode, and a lower energy band diagram corresponds to another condition that a gate voltage (VG= VGS) is applied to the gate electrode.

In this embodiment, as shown in FIG. 11A, a film thickness direction of the semiconductor layer 23 in which the conductive particles 8 are dispersed agrees with a transit direction of the carriers. Also, the gate electrodes (or the third electrode) 27 connected with the semiconductor layer 23 is provided to control the potential and Fermi level of a channel in which the carriers pass, or an excitation level in each of the conductive particles 8.

Also, a resonant tunneling barrier layer 29 is formed in a three-layer structure in which a well layer 29b formed of an n-GaAs layer having a small band gap is sandwiched between a pair of barrier layers 29a, 29c respectively formed of an n-AlGaAs layer having a large band gap. The resonant tunneling barrier layer 29 is placed between a source layer 30 formed of an n-GaAs layer and the semiconductor layer 23 formed of an i-GaAs layer functioning as a channel layer. The drain layer 22 formed of the n-AlGaAs layer is placed contacting the semiconductor layer 23 at a side opposite to the source layer 30. In addition, the resistance modulation device according to the seventh embodiment additionally comprises the source electrode (or the first electrode) 26 connected to the source layer 30, the gate electrodes (or the third electrode) 27 connected to the semiconductor layer 23 and the drain electrodes (or the second electrode) 28.

In the above configuration of the resistance modulation device (or the semiconductor device), as shown in FIG. 11B, energy levels of conduction electrons are quantized in the well layer 29b of the resonant tunneling barrier layer 29. A voltage is applied to the resonant tunneling barrier layer 29 between the source layer 30 and the semiconductor layer 23, and a Fermi energy in the source layer 30 is changed. When the Fermi energy in the source layer 30 agrees with one of the energy levels in the well layer 29b, conduction electrons (or carriers) are moved from the source layer 30 to the channel layer 23.

Therefore, the conduction electrons having a particular energy are selected and injected into the channel layer 23 in which the conductive particles 8 are dispersed, and the resonance scattering between the conductive particles 8 and a group of the conduction electrons is generated. Accordingly, the resistance of the channel can be controlled.

As is described above, the semiconductor layer in which the conductive particles are contained is utilized as a transit region (or a channel) in the semiconductor device (or the resistance modulation device) according to the embodiments of the present invention.

Accordingly, by means of the third electrode controlling either the Fermi energy or the electric potential in the semiconductor layer, the energy of the carriers, the amount of the carriers, or the excitation levels in each of the conductive particles can be electrically changed.

Therefore, the resonance scattering between a group of the conductive particles and a group of the carriers are electrically controlled, the spread of the depletion layers from the conductive particles are electrically controlled by changing the density of the carriers existing around the conductive particles, so that the resistance of the semiconductor layer can be controlled. In addition, a high processing speed, a high driving performance and a low consumed electric power can be obtained in the semiconductor device by narrowing the width of a resonance energy.

Also, the excitation levels of electrons, plasmons or phonons in each of the conductive particles and the various types of excitation spectra are changed by applying the magnetic field to the semiconductor layer, the energy levels in the conductive particles are changed. With this, since the resonance scattering of the carriers is controlled, the resistance of the semiconductor layer can be controlled. Accordingly, a magnetic head having a higher detecting speed and a higher sensitivity than those of a conventional one can be provided.

In addition, a plane direction or a film thickness direction of the semiconductor layer in which the conductive particles are contained is set to agree with a transit direction of the carriers. Therefore, the configuration of the semiconductor device according to the present invention can be selected from among various configurations. Also, when the film thickness of the semiconductor layer and/or a width of the carrier transit region are appropriately adjusted, the carriers classified as the two dimensional electron gas are generated, or a carrier path can be formed in a quantum thinned-line structure.

Accordingly, the mobility of the carriers can be improved, and the semiconductor device having a larger resistance modulation, a higher processing speed and a higher driving performance can be provided. Also, the semiconductor device which is proof against noises and is appropriate to a high temperature operation can be provided.

What is claimed is:

1. A semiconductor device, comprising:

a semiconductor layer having a channel region;

a carrier supply layer formed on the semiconductor layer;

a source electrode and a drain electrode formed above the carrier supply layer, the source electrode and drain electrode facing each other through the channel region; and a gate electrode formed on the carrier supply layer and above the channel region of the semiconductor layer;

wherein said semiconductor layer dispersedly includes fixed particles at least in the channel region, said each particle, which is conductive itself, is an aggregation of atoms selected from the group consisting of metal material, semiconductor material and superconductor material, and a resistance of said channel region is varied by controlling a resonance scattering between carriers passing through the channel region and said particles by voltage applied from said gate electrode.

2. The semiconductor device according to claim 1, wherein the semiconductor layer is made of GaAs or InGaAs and the conductive particles are metallic As particles.

3. The semiconductor device according to claim 2, wherein the metallic As particles have sizes between several tens angstroms to 200 angstroms.

4. The semiconductor device according to claim 2, wherein the metallic As particles are dispersed in the semiconductor layer with a dispersion density of about 1%.

5. The semiconductor device according to claim 1, further comprising a contact layer formed between the source/drain electrodes and the carrier supply layer.

6. The semiconductor device according to claim 1, wherein the semiconductor layer has a thickness of about a Fermi wavelength of the carriers.

7. The semiconductor device according to claim 2, wherein the semiconductor layer made of GaAs or InGaAs has a thickness of about 100 angstroms.

8. The semiconductor device according to claim 1, wherein the channel region in the semiconductor layer has a width of about a Fermi wavelength of the carriers.

9. The semiconductor device according to claim 1, wherein the semiconductor layer is an impurity non-doped semiconductor layer.

10. The semiconductor device according to claim 1, wherein the semiconductor layer is an impurity doped semiconductor layer.

11. A semiconductor device, comprising:
a semiconductor layer having a channel region, the semiconductor layer including at least in the channel region conductive particles by which carriers are scattered;
a carrier supply layer formed on the semiconductor layer;
a source electrode and a drain electrode formed above said carrier supply layer, the source and the drain electrodes being arranged to face with each other through the channel region of the semiconductor layer; and
a first split-gate electrode formed on the carrier supply layer and between the source and the drain electrodes, the first split gate electrode having a length extending along a direction substantially perpendicular to a main transit direction of the carriers, and the gate electrode being split into a first part and a second part between which a narrow space is formed above the-channel region.

12. The semiconductor device according to claim 11, wherein the semiconductor layer is made of GaAs or InGaAs, the conductive particles are metallic As particles, and the narrow space between the first and the second parts of the first split-gate electrode is about 400 nm.

13. The semiconductor device according to claim 11, further comprising a second split gate electrode formed on the carrier supply layer and between the source and the drain electrode, the second split gate electrode being arranged in parallel with the first split gate electrode and having a third part and a fourth part being spaced apart from each other with a narrow space.

14. The semiconductor device according to claim 11, further comprising a first control electrode formed on the carrier supply layer and between the first split-gate electrode and the drain electrode, the first control electrode having a length along a direction parallel to the first split-gate electrode.

15. The semiconductor device according to claim 14, wherein the conductive particles are dispersed in a first region of the semiconductor layer, the first region being under the control electrode.

16. The semiconductor device according to claim 14, further comprising a second control electrode formed on the carrier supply layer and between the first split-gate electrode and the source electrode, the second control electrode having a length along the direction parallel to the first split-gate electrode.

17. The semiconductor device according to claim 13, wherein the conductive particles are dispersed in a second region of the semiconductor layer, the second region being between the first and the second split gate electrodes.

18. The semiconductor device according to claim 13, wherein respective ends of the first and the second split-gate electrodes on a side of the channel region are connected with each other.

19. The semiconductor device according to claim 18, wherein respective ends of the first and the second split-gate electrodes on another side of the channel region are also connected with each other.

20. The semiconductor device according to claim 18, further comprising a third control electrode formed on the carrier supply layer and between respective ends of the first and the second split-gate electrodes.

21. The semiconductor device according to claim 11, wherein the first split-gate electrode limits a width of a carrier transit region in the semiconductor layer to about a Fermi wavelength of the carriers.

22. A semiconductor device, comprising:
a semiconductor drain layer;
a drain electrode formed in contact with the semiconductor drain layer;
a semiconductor layer formed on the semiconductor drain layer, the semiconductor layer containing conductive particles by which carriers are scattered;
a gate electrode formed on the semiconductor layer, the gate electrode being formed to surround a periphery of the semiconductor layer;
a source layer formed above the semiconductor layer, the source layer being placed around a central part of the semiconductor layer; and
a source electrode formed above the source layer.

23. The semiconductor device according to claim 22, further comprising a resonant tunneling barrier layer formed between the semiconductor layer and the source layer.

24. The semiconductor device according to claim 23, wherein the resonant tunneling barrier layer includes a well layer and a first barrier layer and a second barrier layer sandwiching the well layer.

25. The semiconductor device according to claim 22, wherein the semiconductor layer is made of GaAs or InGaAs, and the conductive particles are metallic As particles.

26. A semiconductor device, comprising:
a semiconductor layer having a channel region, the semiconductor layer including at least in the channel region conductive particles by which carriers are scattered;
a carrier supply layer formed on the semiconductor layer; and
a source electrode and a drain electrode formed above the carrier supply layer, the source and drain electrodes facing each other through the channel region;
wherein the conductive particles in the semiconductor layer change energy levels thereof by corresponding to an external magnetic field to yield a resistivity change in the semiconductor layer.

27. The semiconductor device according to claim 26, further comprising a magnetic field generating means being placed above the channel region and between the source electrode and the drain electrode.

28. The semiconductor device according to claim 26, wherein the semiconductor layer is an impurity doped semiconductor layer.

29. The semiconductor device according to claim 26, wherein the semiconductor layer is an impurity undoped semiconductor layer having a channel region.

30. A semiconductor device, comprising:

a channel layer in which carriers flow;

a source electrode supplying the carriers to the channel layer and a drain electrode collecting the carriers flowed through the channel layer, each formed above the channel layer; and a gate electrode formed above a channel region of the channel layer;

wherein said channel layer dispersedly includes fixed particles at least in the channel region, said each particle, which is conductive itself, is an aggregation of atoms selected from the group consisting of metal material, semiconductor material and superconductor material, and a resistance of said channel region is varied by controlling a resonance scattering between carriers passing through the channel region and said particles by voltage applied from said gate electrode.

\* \* \* \* \*